United States Patent [19]

Noga

[11] Patent Number: 6,002,298

[45] Date of Patent: Dec. 14, 1999

[54] RECONSTITUTED FREQUENCY MODULATION WITH FEEDFORWARD DEMODULATOR

[75] Inventor: Andrew J. Noga, Westmoreland, N.Y.

[73] Assignee: The United States of America as represented by the Secretary of the Air Force, Washington, D.C.

[21] Appl. No.: 09/096,412

[22] Filed: Jun. 11, 1998

[51] Int. Cl.[6] .................................................. H03D 3/00
[52] U.S. Cl. ........................... 329/300; 329/304; 329/315; 329/345; 375/324; 455/214
[58] Field of Search .................................. 329/300, 304, 329/315, 336, 345; 375/324; 455/214

[56] References Cited

U.S. PATENT DOCUMENTS

| | | | |
|---|---|---|---|
| 4,817,116 | 3/1989 | Akaiwa et al. | 329/304 |
| 4,849,706 | 7/1989 | Davis et al. | 329/304 |
| 5,511,097 | 4/1996 | Tsumura | 329/300 |

Primary Examiner—Siegfried H. Grimm
Attorney, Agent, or Firm—Harold L. Burstyn; Luis Ortiz

[57] ABSTRACT

Apparatus and method for estimating the angle-modulation imposed on a transmitted Radio Frequency (RF) or Intermediate Frequency (IF) carrier. The method estimates angle-modulation when communications channels add distortions such as noise to transmitted signals. The system provides reconstituted frequency modulation from a feedforward demodulator. The goal is to reduce the modulation index of a desired signal and to employ a narrower band-pass filter that passes this signal while rejecting the distortion that accompanies it. A plurality of stages, 1 through M, exist within the system. Stages 2 through M contain the same components, although filter coefficients and alignment delays may differ from stage to stage. Stage 1 of the demodulator differs slightly from the remaining stages, since the only input required by Stage 1 is a complex envelope signal that contains both the desired signal and the distortion added by the channel. The output of any particular stage of the demodulator consists of complex envelope signals and a real FM estimate. Each output from a stage p serves as input to stage p+1, for $2 \leq p+1 < M$. The phase modulation estimate can be an output of Stage M.

24 Claims, 9 Drawing Sheets

RECONSTITUTED FREQUENCY MODULATION WITH FEEDFORWARD DEMODULATOR

STATEMENT OF GOVERNMENT INTEREST

The U.S. Government has certain rights to this invention. The invention described herein may be manufactured and used by or for the Government for governmental purposes without the payment of any royalty thereon.

FIELD OF THE INVENTION

The present invention is related to angle-modulation recovery or estimation processes and, more particularly, to a feedforward demodulator. Such a demodulator can obtain an enhanced estimate of the angle-modulation imposed on a transmitted Radio Frequency ("RF") or Intermediate Frequency ("IF") carrier when the communications channel adds distortions such as noise to the transmitted signal.

BACKGROUND OF THE INVENTION

General reference is made to S. Haykin, *Commnunications Systems*, ($3^{rd}$ Ed. New York, John Wiley & Sons, 1994) for a detailed teaching of angle-modulation systems. Angle-demodulation can be either non-coherent or coherent.

Non-coherent Angle-demodulation

Figure 1:
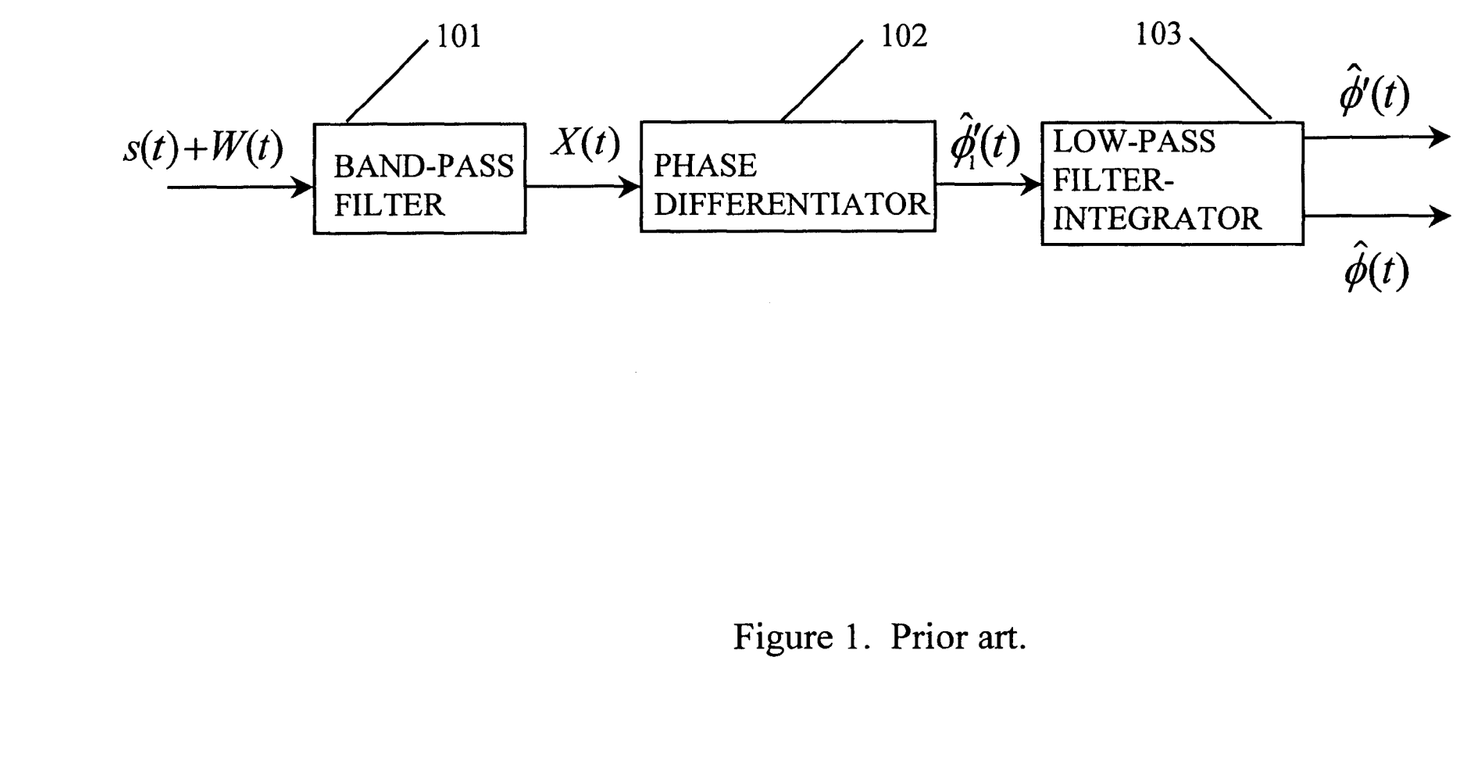
FIG. 1 is a block diagram of prior-art angle-modulation estimation components.

Referring to FIG. 1, typically, non-coherent angle-modulation recovery or estimation uses a band-pass filter 101, a phase differentiator 102, and a low-pass filter/integrator 103. Band-pass filter 101 pre-conditions an input signal by passing through the frequency band occupied by the desired signal, s(t), and rejecting all other frequencies. However, since some of the distortion, W(t), occupies the same frequency band as s(t), band-pass filter 101 passes both the desired signal, s(t), and the distortion, N(t). The output of band-pass filter 101 can thus be modeled as $$X(t) = \{s(t)\}_{BPF} + N(t),$$

where $\{\cdot\}$BPF represents the effects of band-pass filter 101 and $N(t) = \{W(t)\}_{BPF}$. This filtered IF signal, X(t), is then input to a phase differentiator 102. The output is $\hat{\phi}_1'(t)$, as shown.

Among the many ways to carry out this task are (1) zero crossing measurement (which is inversely related to signal frequency) and (2) frequency-to-voltage conversion with envelope detection (often referred to as an FM discriminator). Either measures the rate-of-change of the phase of a signal with respect to time. The signal is processed by a low-pass filter within low-pass filter/integrator 103, whose cut-off frequency is commensurate with the bandwidth of the original message or information signal, m(t). The variable of interest, either $\hat{\phi}'(t)$, the low-pass filtered rate-of-change of phase measurement, or its integral, $$\hat{\phi}(t) = \int_0^t \hat{\phi}'(\tau)d\tau,$$

depends on the type of angle modulation, frequency or phase. For frequency modulation, $\phi(t)$ is generated at the transmitter source as $$\phi(t) = 2\pi \cdot \Delta f \int_0^t m_{FM}(\tau)d\tau,$$

in which case the output signal, $\hat{\phi}'(t) \cong 2\pi \cdot \Delta f \cdot m_{FM}(t)$, is proportional to the original message, $m_{FM}(t)$. Generally, the message signal, $m(t) = m_{FM}(t)$ or $m(t) = m_{PM}(t)$, is normalized such that $-1 \leq m(t) \leq +1$, and the factor $\Delta f$ controls the frequency deviation of s(t). For phase modulation, $\phi(t)$ is generated at the transmitter source as $$\phi(t) = k_p \cdot m_{PM}(t),$$

and the output is $\hat{\phi}(t) \cong k_p \cdot m_{PM}(t)$, where $k_p$ is a proportionality scale factor. More sophisticated angle-modulation systems may employ pre-emphasis/de-emphasis filters that operate on the message signal and the estimated message respectively to help offset the adverse effects of noise. However, without loss of generality, these filters can be modeled as incorporated into our message signal and low-pass filter/integrator 103.

Figure 2:
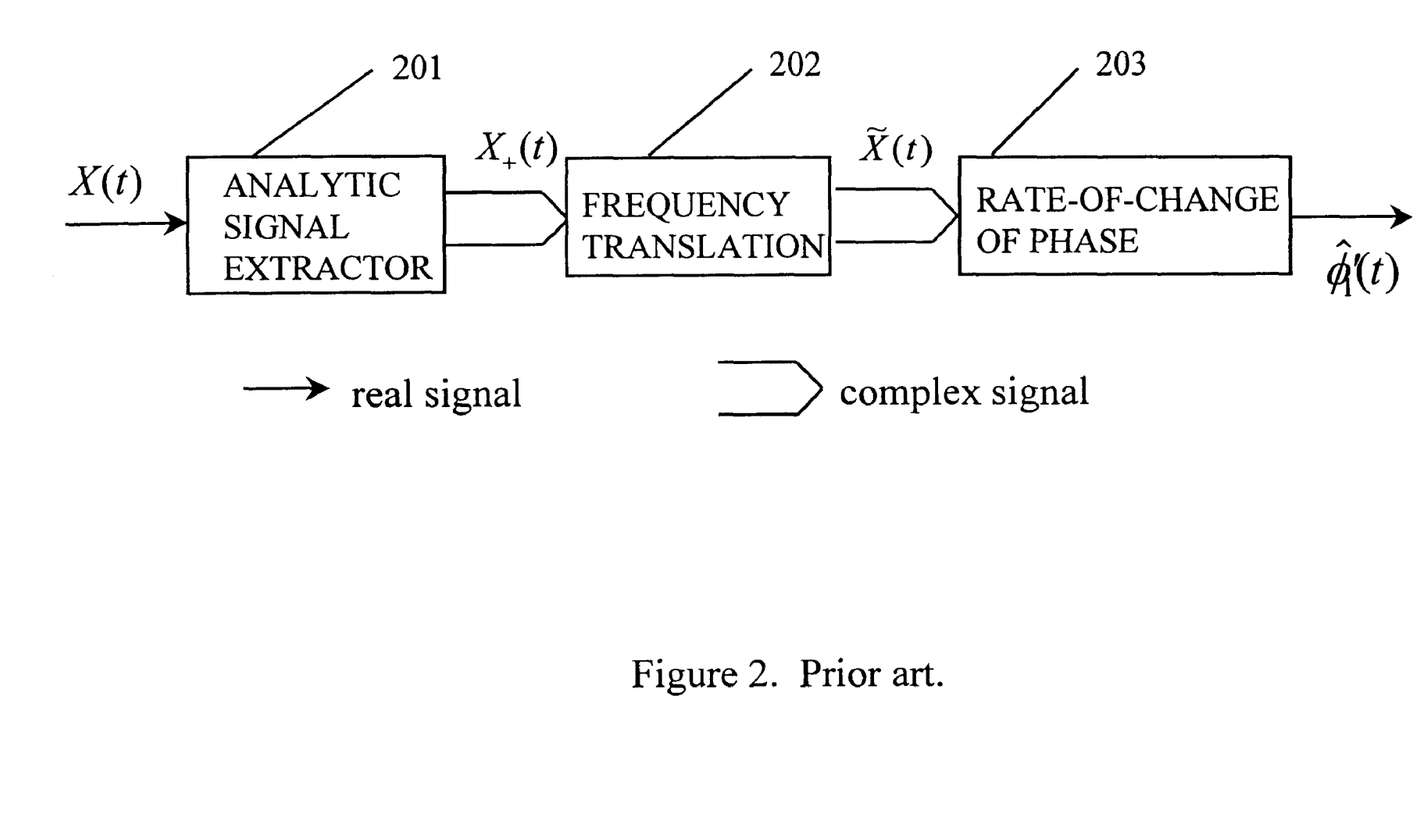
FIG. 2 is a block diagram of a prior-art analytic representation of a phase differentiator.

To employ analytic signal representation in any practical system, the signal processed must be a band-pass signal. FIG. 2 illustrates an equivalent model of phase differentiator 102. An analytic signal extractor 201 generates an analytic signal, $X_+(t)$. This signal contains both the imposed modulation and distortion. It can be represented as $$X_+(t) = |A(t)| \exp\{j \cdot [2\pi f_c t + \phi(t) + \eta(t) - \theta]\}.$$

Here $|A(t)|$ is the envelope of $X_+(t)$, and $\theta$ is a constant phase offset. The term $f_c$ represents the center frequency, which is assumed to be known within a small tuning error. The term $\eta(t)$ represents a phase angle distortion from the imperfect receive channel. Following analytic signal extractor 201, a frequency translation module 202 multiplies the input, $X_+(t)$, by the complex exponential $$z_-(t) = \exp\{-j \cdot 2\pi \hat{f}_c t\},$$

where $\hat{f}_c$ is the known constituent of the center frequency. This complex product produces the complex envelope of X(t). By employing analytic signal notation, the input signal becomes, in complex envelope form $$\tilde{X}(t) = |a(t)| \exp\{j \cdot [2\pi f_e t + \phi(t) + \eta(t) - \theta]\},$$

where $f_e = f_c - \hat{f}_c$ is a small error in tuning frequency. Alternatively, $\tilde{X}(t)$ can be represented in rectangular form as $$\tilde{X}(t) = X_i(t) + jX_q(t),$$

where $X_i(t) = |A(t)|\cos[2\pi f_e t + \phi(t) + \eta(t) - \theta]$ is the real and $X_q(t) = |A(t)|\sin[2\pi f_e t + \phi(t) + \eta(t) - \theta]$ the imaginary component of $\tilde{X}(t)$. The rate-of-change of phase of the complex signal $\tilde{X}(t)$, after processing through a rate-of-change of phase module 203, is $$\hat{\phi}_1'(t) = \frac{d}{dt}\left\{\tan^{-1}\left[\frac{X_q(t)}{X_i(t)}\right]\right\}$$

-continued $$= \frac{X_i(t)\frac{d}{dt}\{X_q(t)\} - X_q(t)\frac{d}{dt}\{X_i'(t)\}}{X_i^2(t) - X_q^2(t)}, \frac{-\pi}{2} < \tan^{-1}\left\{\frac{X_q(t)}{X_i(t)}\right\} < \frac{\pi}{2}.$$

From the above, the rate-of-change of phase of $\tilde{X}(t)$ is $$\hat{\phi}_1'(t) = 2\pi f_e + \phi'(t) + \eta'(t) \text{ (radians per second)}.$$

This estimate contains a bias term, $2\pi f_e$, and an error term, $\eta'(t)$. It can easily be converted to units of Hertz by scaling with the factor $1/2\pi$. We find that for frequency modulation, with the low-pass filtering process indicated as $\{\cdot\}_{LPF}$, $$\hat{\phi}'(t) = \{\hat{\phi}_1'(t)\}_{LPF} = \{2\pi f_e + 2\pi\Delta f \cdot m_{FM}(t) + \eta'(t)\}_{LPF}.$$

For phase modulation, $$\hat{\phi}(t) = \{2\pi f_e t + k_p \cdot m_{PM}(t) + \eta(t) + \theta_c\}_{LPF},$$

where $\theta_c$ is a constant phase offset that depends on initial conditions. Note that $m_{FM}(t)$ and $m_{PM}(t)$ are related as $$k_P \cdot m_{PM}(t) = 2\pi\Delta f \int_0^t m_{FM}(\tau)d\tau.$$

The above summarizes non-coherent angle-demodulation. Each of the many implementations of the method can be modeled as shown. Note that these implementations include non-coherent angle-demodulation techniques that perform, prior to angle-modulation recovery, some type of "hard limiting", or normalization, on the envelope of X(t). This normalization is made evident by the factor $1/(X_i^2(t)+X_q^2(t))$ employed in the phase differentiation process. The purpose of normalization is to desensitize the phase angle measurement to variations in envelope, thus reducing the phase distortion component, $\pi(t)$.

The development above exposes the limitations of the non-coherent method of angle-demodulation. This prior-art method does not take advantage of the fact that the message signal, m(t), and therefore the modulated signal, $$s_+(t) = |a(t)|\exp\{j \cdot [2\pi f_c t + \phi(t) - \theta]\},$$

can be highly correlated at consecutive instants. (Here, |a(t)| is a slowly changing or constant envelope present on the transmitted signal.) More specifically, the spectral content of $m_{FM}(t)$ is essentially limited to some maximum frequency, $f_m$ Hz. Therefore, when the deviation ratio $\beta=\Delta f/f_m$ is large (i.e., greater than 10), it is possible to employ adaptive band-pass filtering prior to measuring rate-of-change of phase. By doing so, the bandwidth of the band-pass filter process can be narrowed, thereby rejecting more of the additive distortion, $W_+(t)$, the analytic constituent of W(t).

An additional related disadvantage of the prior-art, non-coherent method of angle-demodulation arises from the tuning error, $f_e$. This tuning offset can lead to an increase in the distortion, $\eta(t)$, since band-pass filter 101 operates at the estimated center frequency, $\hat{f}_c$. The resulting off-centering of the input signal causes a distortion of the desired signal, so that $\{s(t)\}_{BPF} \neq s(t)$. In particular, the band-pass filter will have undesired attenuation and phase changes near the band edges that affect adversely the angle-demodulation process.

Figure 3A:
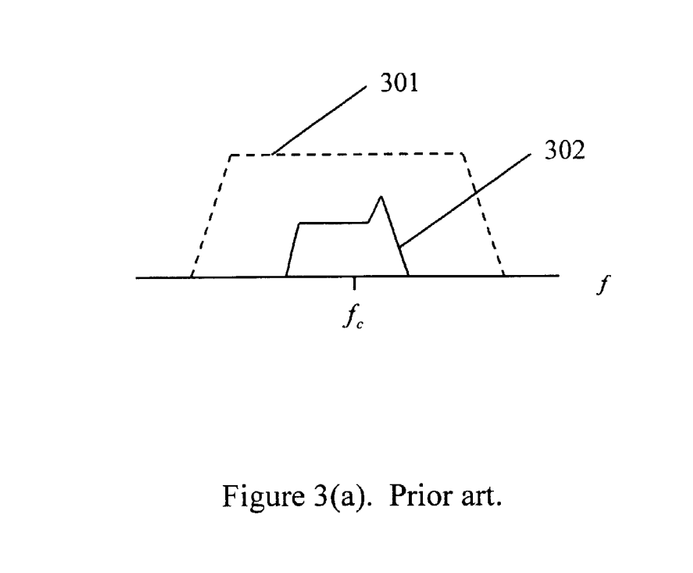
FIG. 3(a) shows frequency domain representations of the correct tuning frequency for a prior-art band-pass filter.
Figure 3B:
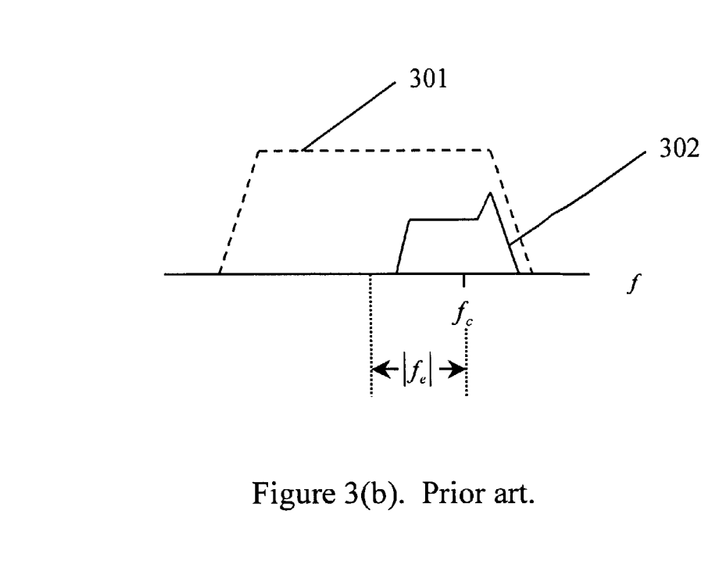
FIG. 3(b) shows frequency domain representations of a tuning error offset for a prior-art band-pass filter.

FIGS. 3(a) and 3(b) demonstrate this tuning error. FIG. 3(a) shows correct tuning frequency; FIG. 3(b), tuning error offset. Referring to FIGS. 3(a) and 3(b), dashed lines represent a magnitude response 301 of band-pass filter 101. The corners of the dashed lines show the lower and upper cut-off frequencies of band-pass filter 101. Solid lines represent a modulated signal spectrum 302.

Referring to FIG. 3(a), band-pass filter 101 causes little or no distortion, since modulated signal spectrum 302 falls entirely within the pass-band between the cut-off frequencies. Referring to FIG. 3(b), because modulated signal spectrum 302 goes beyond the upper cut-off frequency, magnitude response 301 of band-pass filter 101 distorts modulated signal spectrum 302.

Coherent Angle-demodulation

L. H. Enloe, "Decreasing the Threshold in FM by Frequency Feedback," 50 *Proc, IRE* 18–30 (January 1962) provides an overview of coherent angle-demodulation and addresses its limitations and disadvantages. The advantage of coherent over non-coherent angle-demodulation methods is that coherent methods utilize the a priori knowledge that a signal has a large modulation index, $\beta$. Coherent methods are therefore able to reject more of the additive distortion, $W_+(t)$, while minimizing the rejection of the desired signal, $s_+(t)$.

The prior art teaches two specific coherent angle-demodulation methods in particular: phase lock loop (PLL) and FM with feedback (FMFB). There is no consensus which device performs better. J. A. Develet Jr., "Statistical Design and Performance of High-Sensitivity Frequency Feedback Receivers," *IEEE Trans. On Military Electronics* 281–284 (October 1963), identifies PLL and FMFB devices as "equivalent servo-mechanisms" under reasonable input signal and loop conditions. This discussion therefore presents only the FMFB demodulator.

Figure 4:
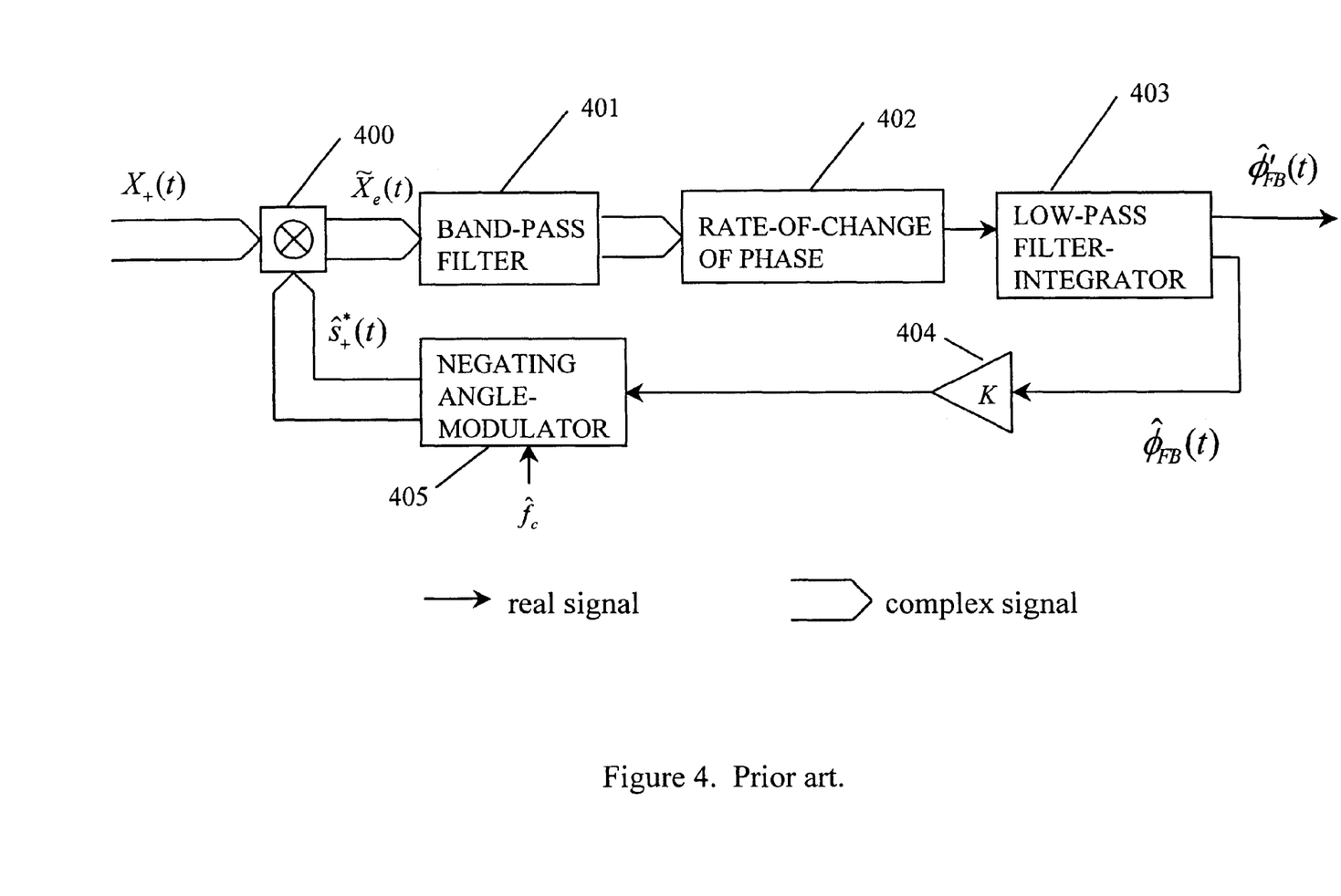
FIG. 4 shows a prior-art analytic representation and implementation of a FMFB demodulator.

Referring to FIG. 4, the FMFB demodulator employs low-pass filtering and integration within the device itself. However, further low-pass filtering and integration processes can be performed externally to the FMFB demodulator. Thus the FMFB demodulator replaces phase differentiator 102 of FIG. 1. If the negative of the derivative of the angle of the unit-envelope prediction signal, $\hat{s}_+^*(t)$, closely follows the derivative of the angle of the modulated constituent of input signal, $X_+(t)$, then the output of a complex multiplier 400

$$\tilde{X}_e(t) = X_+(t) \cdot \hat{s}_+^*(t)$$

contains a signal constituent with a reduced modulation index. This message-bearing constituent of the signal, $\tilde{X}_e(t)$, can pass through a band-pass filter 401, which is narrower than band-pass filter 101. For $N_+(t)$, the analytic constituent of the distortion component, when $N_+(t)$ and $s_+(t)$ are not highly correlated and $s_+(t)$ has sufficient strength, band-pass filter 401 passes less of $N_+(t)$.

As a practical matter, band-pass filter 401 is a pair of identical real-valued low-pass filters, each operating on the real and imaginary components of $\tilde{X}_e(t)$. Thus the input and output of band-pass filter 401 are complex. Since band-pass filter 401 operates at an IF of 0 Hz, both the input and output are complex envelope signals. As such, a rate of-change of phase module 402 can be implemented as previously described. Passing this result to a low-pass filter/integrator 403 results in the reduced index frequency modulation estimate, $\hat{\phi}_{FB}'(t)$. Given that the goal is to reduce as far as possible the modulation index at the output of band-pass filter 401, $\hat{\phi}_{FB}'(t)$ can be viewed as an error signal, which should approach some small level. By integrating this "error signal" to obtain $\hat{\phi}_{FB}(t)$ and by controlling sensitivity with a feedback gain 404, K, we can maintain a good quality prediction signal, $\hat{s}_+^*(t)$. A negating angle-modulator 405 simply generates the unit-envelope prediction signal, $$\hat{s}_+^*(t) = \exp\{-j \cdot [2\pi \hat{f}_c t + K \hat{\phi}_{FB}(t)]\},$$

which reduces the modulation index of $s_+(t)$. Thus negative feedback is employed through the phase of the prediction signal, $\hat{s}_+^*(t)$. With proper choice of feedback gain 404, band-pass filter 401, and low-pass filter/integrator 403, the FMFB system remains stable and reliably demodulates the input, $X_+(t)$.

Though there are limitations to coherent angle-demodulation, both FMFB and PLL demodulators reduce the distortion, $\eta(t)$, in large $\beta$ systems. Specifically, these methods reduce the FM threshold effect, where a rapid decrease in output signal-to-noise ratio ("SNR") occurs for small decreases in input SNR. This threshold occurs at or about 10 dB input SNR. Threshold improvements from 3 to 7 dB or more have been reported. Another advantage of the coherent method is that the adverse effects of a tuning error, $f_e$, can be mitigated, as coherent angle-demodulation tracks the center frequency, $f_c$, thereby providing automatic tuning.

Coherent angle-demodulation has disadvantages. In a system with large $\beta$, processing with a particular combination of feedback gain 404, band-pass filter 401, and low-pass filter/integrator 403 can reduce the noise substantially. However, such processing can also cause excessive distortion of the original modulation. The coherent angle-demodulator provides no mechanism to compensate for this distortion.

Another disadvantage of the coherent angle-demodulator is that the modulation index is reduced. While a lower modulation index allows band-pass filter 401 to reduce the additive distortion, $N(t)$, there is a commensurate reduction in the strength of the recovered modulation signal. The result is that coherent methods perform essentially the same as non-coherent methods of angle modulation recovery at input SNR values above threshold.

Standard Angle-Demodulation Results

Figure 5:
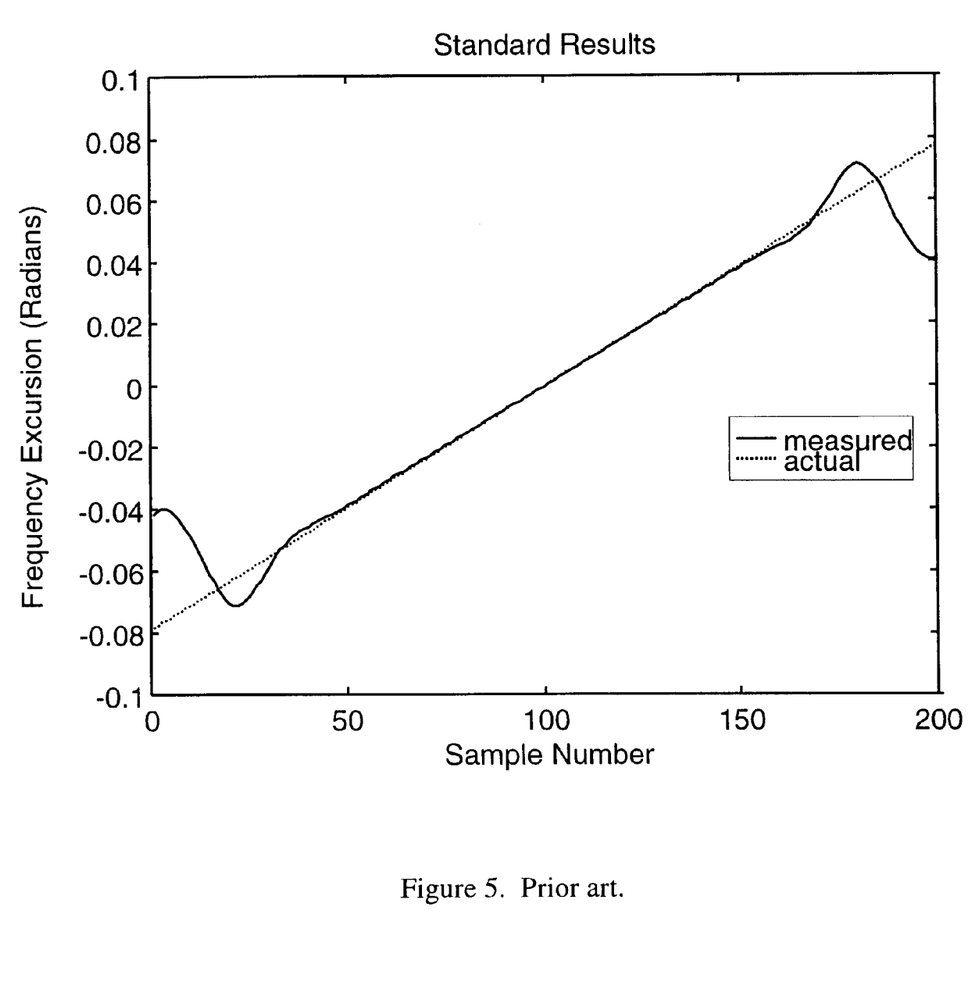
FIG. 5 is a graphical representation of recovered FM modulation as measured by a standard angle-demodulator.

Referring to FIG. 5, simulation results are presented for the FM demodulation of a pulsed carrier with imposed frequency modulation to demonstrate typical angle-demodulation. A discrete-time implementation employed the common rate, $F_s$, of two samples per second. (This arbitrary but convenient choice of sample rate for simulations leads to a Nyquist bandwidth of 1 Hz.) The results come from a backward-difference FM demodulator with no explicit low-pass post filtering.

This demodulator is described in detail by the present inventor in "Numerical FM Demodulation Enhancements," Rome Laboratory Technical Report RL-TR-96-91, June 1996. The imposed FM modulation was a linearly varying instantaneous frequency, from approximately –0.08 radians, to +0.08 radians. Additive white Gaussian noise ("AWGN") was combined with the pre-pulsed carrier at a SNR of 30 dB. Pulses were 200 samples in duration. A total of 100 pulses were generated, band-pass filtered, demodulated, and the results averaged for comparison to the actual imposed FM modulation.

The band-pass filter was implemented in complex form with a finite-impulse response ("FIR") filter of 129 coefficients resulting from the Hanning windowed method of FIR filter design. A cutoff frequency of 0.25/4 Hz was used.

Figure 6:
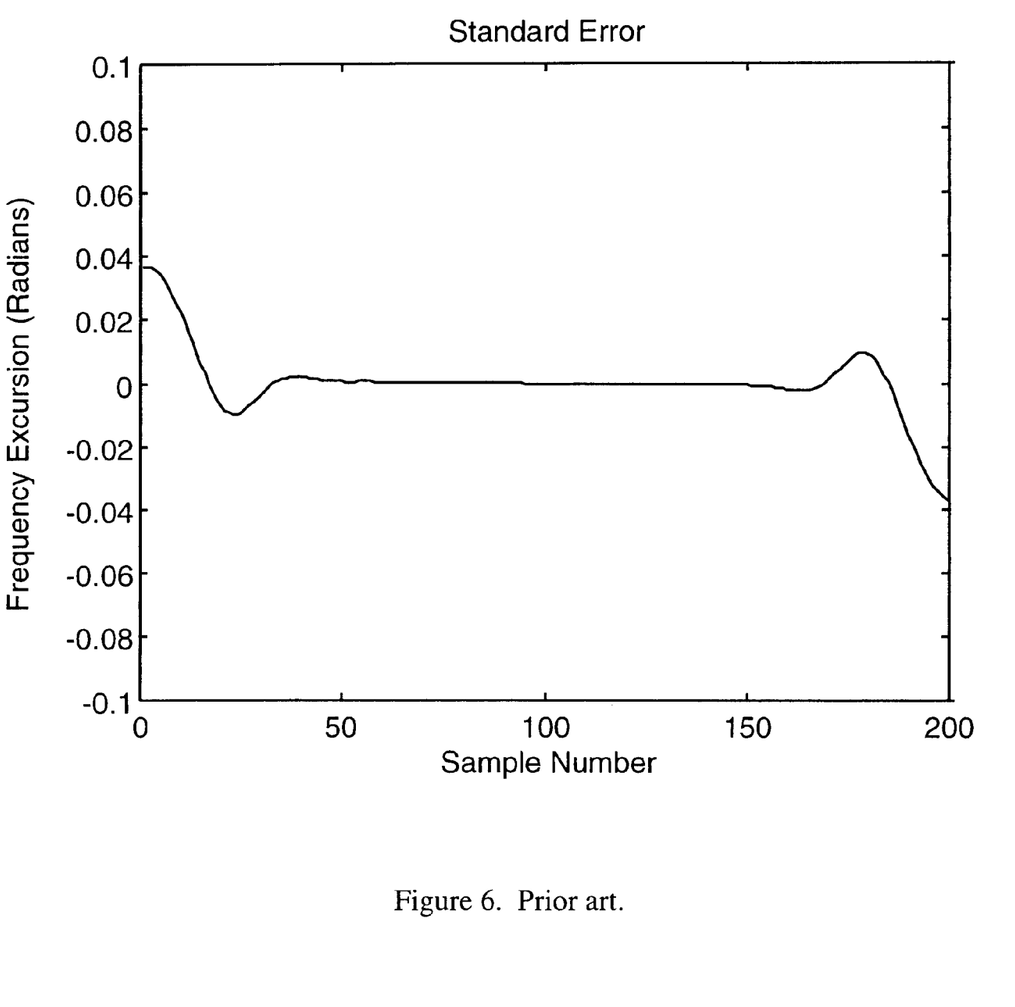
FIG. 6 is a graphical representation of recovered FM modulation error resulting from a standard angle-demodulator.

Referring to FIG. 6, the difference between the measured and actual FM modulation was also determined. The corresponding root-mean-square ("RIMS") error was 0.015182 radians.

The previous discussion demonstrates the drawbacks of the prior art. What is needed is an improved system and method to estimate the angle-modulation imposed on a transmitted RF or IF carrier, especially when communications channels add distortions such as noise to transmitted signals.

All of the references cited herein are incorporated by reference in their entireties for their teachings.

OBJECTS AND SUMMARY OF THE INVENTION

Therefore, one object of the present invention is to provide a system and method to estimate the angle-modulation imposed on a transmitted RF or IF carrier that overcomes the drawbacks of the prior art.

Another object of the present invention is to provide a system and method of angle-demodulation that takes advantage of the high correlation of message signals/modulated signals at consecutive instances.

Still another object of the present invention is to provide a method or system that avoids the distorting effects of off-centering of input signals and undesirable attenuation and phase changes near band edges, both of which adversely affect angle-demodulation, by increasing the width of the prior-art band-pass filter.

A further object of the present invention is to provide a method or system of coherent angle-demodulation that avoids excessive distortion of original modulations in large $\beta$ systems.

Still a further object of the present invention is to provide a method or system of angle-demodulation that avoids a commensurate reduction in the strength of recovered modulation signals where only the reduction of additive distortion is sought.

Briefly stated, the present invention provides apparatus and method for estimating the angle-modulation imposed on a transmitted Radio Frequency (RF) or Intermediate Frequency (IF) carrier. The method estimates angle-modulation when communications channels add distortions such as noise to transmitted signals. The system provides reconstituted frequency modulation from a feedforward demodulator. The goal is to reduce the modulation index of a desired signal and to employ a narrower band-pass filter that passes this signal while rejecting the distortion that accompanies it. A plurality of stages, 1 through M, exist within the system. Stages 2 through M contain the same components, although filter coefficients and alignment delays may differ from stage to stage. Stage 1 of the demodulator differs slightly from the remaining stages, since the only input required by Stage 1 is a complex envelope signal that contains both the desired signal and the distortion added by the channel. The output of any particular stage of the demodulator consists of complex envelope signals and a real FM estimate. Each output from a stage p serves as input to stage p+1, for $2 \leq p+1 \leq M$. The phase modulation estimate can be an output of Stage M.

According to an embodiment of the invention, a system for estimating angle-modulation imposed on a transmitted electromagnetic signal, comprises a feedforward demodulator for reducing the modulation index of a signal component modulated by a message that further comprises; at least one band-pass filtering (BPF) module for passing the signal component while rejecting distortion components; at least one FM demodulator/low-pass filtering module (FMD-LPF) for performing, after processing by the at least one BPF module, rate-of-change of phase measuring and low-pass filtering commensurate with the message's bandwidth; at least one alignment delay (TAD) module for delaying signal inputs by amounts equal to the sum of the delays introduced by the at least one BPF module and a low-pass filtering (LPF) portion of the at least one FMD-LPF module; at least one summation module for summing TAD and FMD-LPF outputs for the signal component; at least one integrator for inverting rate-of-change of phase measurements for the signal component; and at least one exponential modulation module for processing the signal component to negate an output of the integrator module prior to modulating a complex exponential with a phase-message signal estimate, thereby generating a conjugated estimate of the signal component, the conjugated estimate containing the angle modulation.

According to a feature of the invention, a system for estimating angle-modulation imposed on an electromagnetic signal comprises a plurality of stages 1 through M: (i) stage 1 of the system further comprises an input for receiving an incoming complex envelope signal that contains both (1) a desired component modulated by a message and (2) additive distortion; and (ii) stages 2 through M of the system each further comprise an input for receiving the incoming complex envelope signal from a previous stage and an output for providing the incoming complex envelope signal to a subsequent stage, the output further comprising estimates of (1) a real FM signal and (2) a conjugate of the incoming complex envelope signal; the output of any particular stage p comprising at least one aligned signal that serves as input to a following stage if present; the at least one aligned signal being aligned within multiple stages, thereby allowing feedforward; and a demodulator correcting signal distortion by iteratively estimating the message from stage to stage.

According to another feature of the invention, a method, including a plurality of stages, for estimating angle-modulation of an electromagnetic signal, comprises the steps of: band-pass filtering a complex envelope signal derived from the electromagnetic signal to reject distortion; measuring a rate-of-change of phase of the complex envelope signal after the step of band-pass filtering; low-pass filtering the rate-of-change of phase commensurate with bandwidth of a message component of the complex envelope signal; the steps of band-pass filtering, measuring, and low-pass filtering yielding a real signal derived from the complex envelope signal; setting for each stage a first delay for the complex envelope signal equal to any delay introduced in the steps of band-pass and low-pass filtering; for all stages except a first, setting a second delay for the real signal equal to the first delay; for each stage after the first, summing (1) the real signal as modified by the second delay if present and prior stages if any and (2) an output from the steps of band-pass and low-pass filtering; integrating the real signal as modified by the second delay and prior stages if any; processing a negated output of the step of integrating to produce a modulated signal; and transmitting at least one signal modified by the steps of band-pass filtering, measuring, low-pass filtering, setting, summing, integrating, and processing from one stage to a following stage if one is present.

The present invention provides a system and method for estimating the angle-modulation imposed on a transmitted RF or IF carrier when the communications channel adds distortion such as noise to transmitted signals. Angle-demodulation of the present invention provides reconstituted frequency modulation with a feedforward demodulator, hereinafter an "R-FMFF demodulator." The goal of the R-FMFF demodulator of the present invention is to reduce the modulation index of the desired signal component and to employ a narrower band-pass filter to pass this signal component while rejecting the distortion component. The present invention offers the same benefits as prior-art FMFB demodulators as it overcomes their disadvantages and limitations.

If we enhance the threshold by reducing the modulation index and subsequent band-pass filtering, the original modulation can be unacceptably distorted. This distortion follows from setting the bandwidth of the band-pass filter to be narrower than the bandwidth needed to process the reduced-index signal. The present invention comprises M stages, where M>1, provides a mechanism to compensate for this distortion by iteratively estimating from stage to stage. This iterative estimation reduces the final modulation index so that the band-pass filter in Stage M is wide enough to pass the reduced-index signal and narrow enough to reject the additive distortion.

An additional advantage of the present invention is that modulation reconstitution occurs for each stage that follows the initial stage. Distortion is thus decreased, and not at the expense of reducing signal modulation. Thus the present invention not only minimizes additive distortion; it also maximizes recovered signal strength. Subsequently, at input SNR values above threshold, the invention can outperform the coherent and non-coherent methods of angle-modulation recovery of the prior art.

Another advantage of the invention is that it continues to provide threshold reduction for various input signal scenarios, where $\beta$ is decreased, including scenarios where the modulated signal is narrow-band.

These and many other objects and advantages of the present invention will be readily apparent to one skilled in the pertinent art from the following detailed description of a preferred embodiment of the invention and the related drawings, in which like reference numerals designate the same elements.

DETAILED DESCRIPTION OF THE PREFERRED EMBODIMENT

Figure 7:
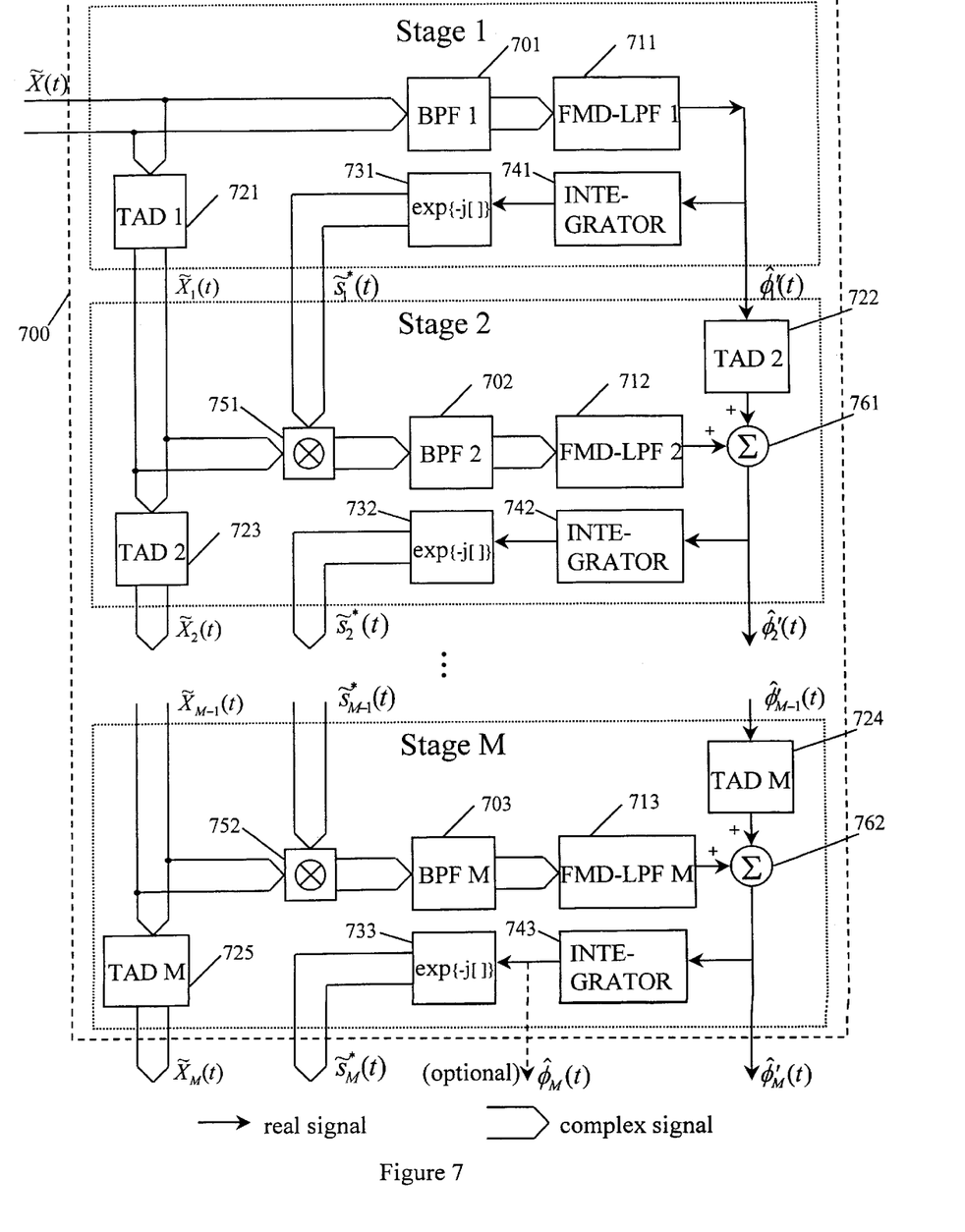
FIG. 7 is a block diagram of a reconstituted-frequency-modulation-with-feedforward demodulator ("R-FMFF") of the present invention.

Referring to FIG. 7, in a R-FMFF demodulator 700 of the present invention, signals are fed forward from stage to stage and within each stage, rather than fed back to track the input. Shown in FIG. 7 are stages 1 through M (or 1, 2, and M). The input to this system is the complex envelope signal, $\tilde{X}(t)$, which contains both the desired signal constituent, s(t), and the additive distortion constituent, $\tilde{N}(t)$. Each of Stages 2 through M of the R-FMFF demodulator includes: (1) a band-pass filter ("BPF"), shown as BPF 701, 702, 703; (2) a FM demodulator-low-pass filter ("FMD-LPF"), shown as FMD-LPF 711, 712, 713; and (3) an alignment delay ("TAD"), shown as TAD 721, 722, 723, 724, 725. Stage 1 of R-FMFF demodulator 700 differs slightly from the remaining stages, since the only necessary input to this stage is $\tilde{X}(t)$.

The output of any particular stage, p, of R-FMFF demodulator 700 comprises the complex envelope signals, $\tilde{X}_p(t)$, and $\tilde{s}_p^*(t)$, and the real FM estimate, $\hat{\phi}_p'(t)$. These serve as inputs to stage p+1, for $2 \leq p+1 \leq M$. The phase modulation estimate, $\hat{\phi}_M(t)$, can optionally be the output of Stage M, either in lieu of or in addition to $\tilde{s}_M^*(t)$, as an application requires. R-FMFF demodulator 700 comprises at least two (2) stages (FIG. 7 shows more than two (2) stages).

The goal of R-FMFF demodulator 700 is the same as that of the FMFB demodulator, namely, to reduce the modulation index of the desired signal component, $\tilde{s}(t)$, and to employ a narrower band-pass filter to pass this signal component and reject the distortion component, $\tilde{N}(t)$. In a typical application each of the band-pass filters, BPF1 701 through BPFM 703, have a bandwidth narrower than the bandwidth of the zero-IF input signal, $\tilde{X}(t)$. As in the prior art, these band-pass filters are implemented as a pair of identical real low-pass filters operating on the real and imaginary components to be processed. The FM demodulation-low-pass filter of each stage, FMD-LPF1 711 through FMD-LPFM 713, perform both rate-of-change of phase measurement and low-pass filtering commensurate with the message signal bandwidth, $f_m$. The alignment delays, TAD1 721 through TADM 725, delay the real or complex signal inputs by amounts equal to the delay introduced by the BPF and the LPF of a particular stage. Thus for any particular stage, p, TADp provides a delay equal to the sum of the delays introduced by BPFp and the low-pass filter portion of FMD-LPFp. Integrators 741, 742, 743, one for each stage, invert the rate-of-change of phase measurement (i.e., the FM demodulation). (For practical purposes, this integration is often implemented modulo-$2\pi$.) Normally, the method of implementing the FMD portion of the FMD-LPF process does not change from stage to stage, thereby enhancing the alignment of the signals at summer ("$\Sigma$") 761, 762 inputs in following stages. An exp$\{-j[\cdot]\}$ process 731, 732, 733 of stage p simply negates the output of the integrator of the same stage prior to exponential modulation (shown in the last module for each stage as exp$\{-j[]\}$), resulting in the conjugate of the $p^{th}$ desired modulated signal estimate, $\tilde{s}_p^*(t)$.

The output of any particular stage, p, therefore, consists of the aligned signals, $\tilde{X}_p(t) = \tilde{X}_{p-1}(t-\tau_p)$, $\tilde{s}_p(t) \cong \tilde{s}_{p-1}(t-\tau_p)$ and $\hat{\phi}_p'(t) \cong \hat{\phi}_p'(t-\tau_p)$, for $2 \leq p \leq M$. Here, $\tau_p$ is the delay introduced by the TADp process. These output signals serve as input to the next stage. The delay alignments eliminate the need for feedback by using a feed-forward approach. The necessary reduction in the modulation index now takes place following Stage 1 (in complex multipliers 751, 752). Thus the complex multiplication of Stage 2 employs $\tilde{s}_1(t)$, an initial estimate of $\tilde{s}(t)$, to reduce the modulation index of $\tilde{s}(t)$. Once processed by BPF2 702 and FMD-LPF2 712, a reconstitution or recombination with $\hat{\phi}_1'(t-\tau_2)$ in $\Sigma$761 replaces the modulation extracted by a complex multiplier 751, resulting in $\hat{\phi}_{22}'(t)$. This process of reducing and reconstituting the modulation index is repeated by each following stage. R-FMFF demodulator 700 therefore carries out an iterative process that refines the output estimates, $\tilde{s}_p^*(t)$ and $\hat{\phi}_p'(t)$. By appropriate choice of BPF1 701 through BPFM 703 and FMD-LPF1 711 through FMD-LPFM 713, R-FMFF demodulator 700 enhances the angle-modulation recovery process in many modulation and additive distortion scenarios where standard methods fail.

Because the Shannon/Nyquist sampling theorem applies to R-FMFF demodulator 700, both discrete-time (numerical) implementations ("RNFMFF") and analog-time (continuous) implementations ("RAFMFF") are possible. In particular, the RNFMFF demodulator can employ symmetric FIR filters with odd coefficient lengths, greatly simplifying TAD implementation and increasing accuracy.

Another embodiment uses a reconstituted-FM-with-feedback demodulator (or equivalent) in stage 1. (See "Numerical FM Demodulation Enhancements," Rome Laboratory Technical Report RL-TR-96-91 (June 1996), whose disclosure is incorporated herein by reference.) Where $\beta$ is large, this modulation tracking device can force the following stages of the R-FMFF demodulator to converge rapidly to an accurate modulation estimate. This convergence can also help where $\beta$ is small and the spectrum of m(t) contains significant energy at frequencies below $f_m$ Hz.

Figure 8:
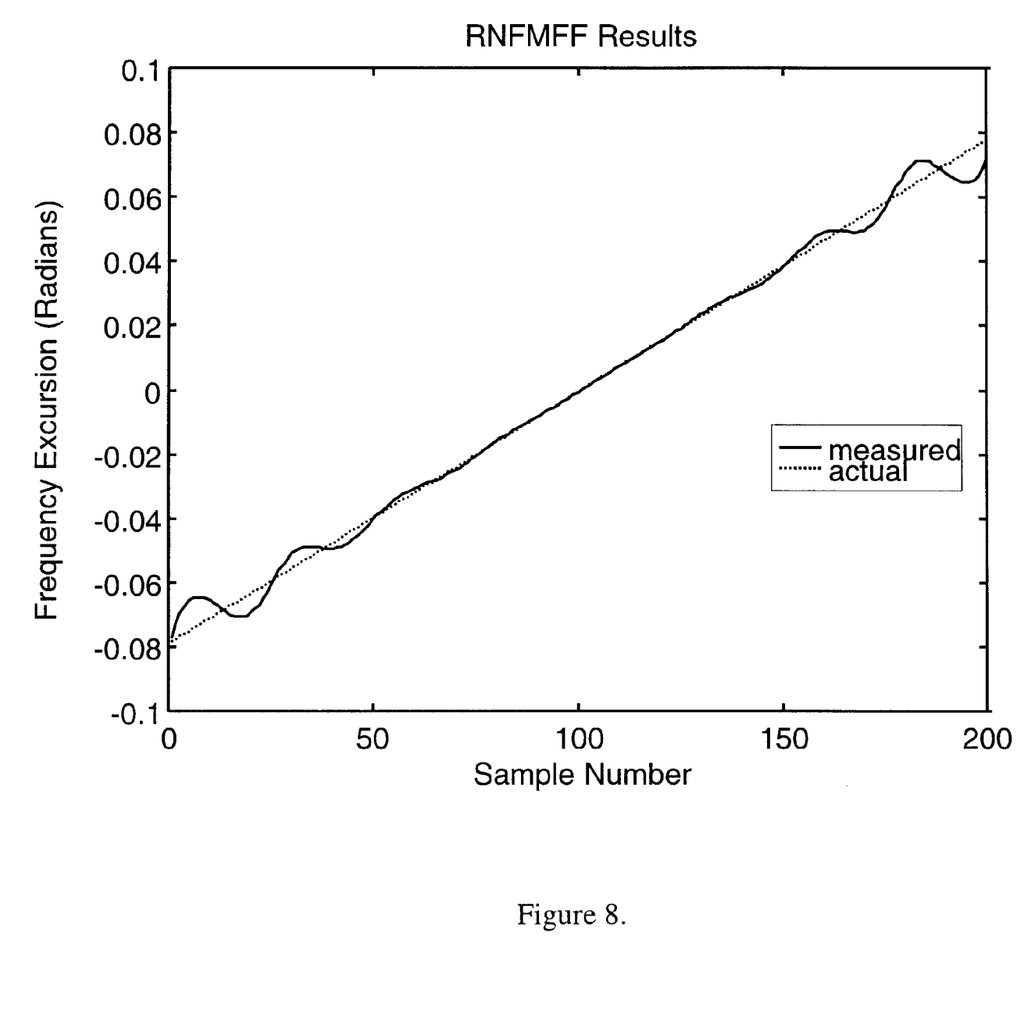
FIG. 8 is a graphical representation of recovered FM modulation as measured by a R-FMFF.
Figure 9:
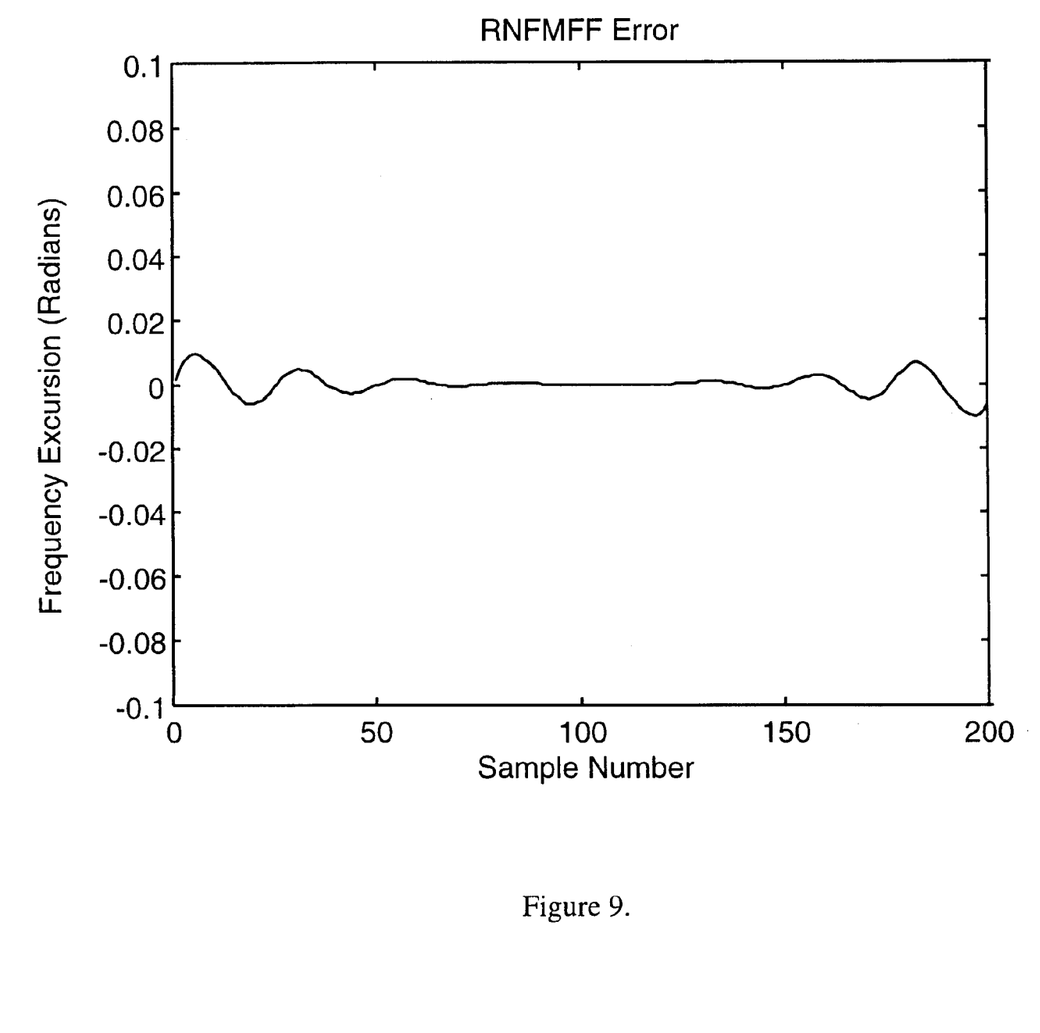
FIG. 9 is a graphical representation of recovered FM modulation measurement error from a R-FMFF demodulator.

To demonstrate the characteristics of the R-FMFF demodulator, a 5-stage RNFMFF demodulator simulation has been tested against the same 100 pulsed carriers used to demonstrate the problems of the prior art. This test allowed for direct comparison to the simulated standard angle-demodulation process. As before, the recovered modulations were averaged together to represent the measured modulation. A backward difference FM demodulator was used in each stage, with no explicit low-pass filtering. The band-pass filter in each stage was identical to that in the simulated standard demodulator. FIG. 8 shows the recovered FM modulation as measured by the RNFMFF demodulator. FIG. 9 shows the error in measuring the recovered FM modulation resulting from the RNFMFF demodulator. Note the significant reduction in error compared to the standard demodulator, whose results are shown in FIGS. 5 and 6. In particular, the beginning and end of the recovered modulation has substantially less error. The corresponding root-mean-square (RMS) error for the RNFMFF measurement was 0.004694 radians. This value represents a 10.2 dB improvement over that of the standard angle-demodulation of the prior art.

While the invention is described with reference to a particular embodiment, this particular embodiment is intended to be illustrative, not limiting. Various modifications may be made without departing from the spirit and scope of the invention as defined in the amended claims. Modifications and alterations will occur to others upon reading and understanding this specification; therefore, it is intended that all such modifications and alterations are included insofar as they come within the scope of the appended claims or equivalents thereof.

What is claimed is:

1. A system for estimating angle-modulation imposed on a transmitted electromagnetic signal, comprising a feedforward demodulator for reducing the modulation index of a signal component modulated by a message, said feedforward demodulator further comprising;
   at least one band-pass filtering (BPF) module for passing said signal component while rejecting distortion components;

at least one FM demodulator/low-pass filtering module (FMD-LPF) for performing, after processing by said at least one BPF module, rate-of-change of phase measuring and low-pass filtering commensurate with said message's bandwidth;

at least one alignment delay (TAD) module for delaying signal inputs by amounts equal to the sum of the delays introduced by said at least one BPF module and a low-pass filtering (LPF) portion of said at least one FMD-LPF module;

at least one summation module for summing TAD and FMD-LPF outputs for said signal component;

at least one integrator for inverting rate-of-change of phase measurements for said signal component; and at least one exponential modulation module for processing said signal component to negate an output of said integrator module prior to modulating a complex exponential with a phase-message signal estimate, thereby generating a conjugated estimate of said signal component, said conjugated estimate containing said angle modulation.

2. The system of claim 1, further comprising a plurality of stages, wherein a first stage initially processes said signal component, and subsequent stages further process said signal component to produce a desired demodulated signal.

3. The system of claim 2 wherein iterative signal estimation refinement provides in stage M a final modulation index reduction such that a BPFM module has a bandwidth effective to pass the reduced-index signal and to reject the additive distortion.

4. The system of claim 2 wherein output of any particular stage comprises complex envelope signals and a real FM estimate and said output serves as input to stage p+1, for $2 \leq p+1 \leq M$.

5. The system of claim 1 wherein said at least one BPF module is designed to have a bandwidth narrower than the bandwidth of a zero-IF input signal.

6. The system of claim 5 wherein said at least one BPF module further comprises a pair of identical real low-pass filters operating on real and imaginary components of a complex input signal.

7. The system of claim 2 wherein said FMD-LPF module of each stage performs both rate-of-change of phase measurement and low-pass filtering commensurate with said message's bandwidth.

8. The system of claim 1 wherein said TAD module delays real or complex signal inputs by an amount equal to the delay introduced by said BPF module and said LPF portion.

9. The system of claim 1 wherein, for any particular stage p, a TADp module provides a delay equal to the sum of the delays introduced by a BPFp module and a LPFp portion of a FMD-LPFp module.

10. The system of claim 2 wherein said at least one integrator inverts by integration the rate-of-change of phase measurement for each stage.

11. A system for estimating angle-modulation imposed on an electromagnetic signal, said system comprising a plurality of stages 1 through M:

i) stage 1 of said system further comprising an input for receiving an incoming complex envelope signal that contains both (1) a desired component modulated by a message and (2) additive distortion; and ii) stages 2 through M of said system each further comprising an input for receiving said incoming complex envelope signal from a previous stage and an output for providing said incoming complex envelope signal to a subsequent stage, said output further comprising estimates of (1) a real FM signal and (2) a conjugate of said incoming complex envelope signal;

said output of any particular stage p comprising at least one aligned signal that serves as input to a following stage if present;

said at least one aligned signal being aligned within multiple stages, thereby allowing feed-forward; and a demodulator correcting signal distortion by iteratively estimating said message from stage to stage.

12. The system of claim 11, further comprising:

a band-pass filtering (BPF) module for each of stages 1 through M for passing said desired component while rejecting said additive distortion;

an FM Demodulation-low-pass filtering module (FMD-LPF) for each of stages 1 through M that performs both rate-of-change of phase measurement and low-pass filtering commensurate with said message's bandwidth;

an alignment delay (TAD) module for stage 1 and pairs of TAD modules for each of stages 2 through M, said TAD modules effective for delaying signal inputs by amounts equal to a delay introduced by said BPF and a low-pass filtering (LPF) portion of said FMD-LPF;

a summation module for each of stages 2 through M effective for summing outputs from said TAD and FMD-LPF modules;

an integrator for each of stages 1 through M effective for integrating rate-of-change of phase measurements for said incoming complex envelope signal after passing through said BPF and said FMD-LPF; and an exponential modulation module for each of stages 1 through M effective for processing said desired component to negate an output of said integrator prior to modulating a complex exponential with a phase-message signal estimate, thereby generating a conjugated estimate of said desired component, said conjugated estimate containing said angle modulation.

13. The system of claim 12 wherein iterative signal estimation results in a final modulation index reduction in Stage M such that a BPFM has a bandwidth effective for passing a reduced-index signal and rejecting the additive distortion.

14. The system of claim 12 wherein said output of any particular stage p comprises complex envelope signals and a real FM estimate and said output serves as input to stage p+1, for $2 \leq p+1 \leq M$.

15. The system of claim 12 wherein each of said BPF module has a bandwidth narrower than the bandwidth of a zero-IF input signal.

16. The system of claim 15 wherein said BPF module comprises a pair of identical real low-pass filters operating on real and imaginary components of a complex input signal.

17. The system of claim 12 wherein said FMD-LPF of each stage performs both rate-of-change of phase measurement and low-pass filtering commensurate with said message's bandwidth.

18. The system of claim 12 wherein each of said TAD modules delays real or complex signal inputs by an amount equal to the sum of the delays introduced by said BPF module and said LPF portion.

19. The system of claim 12 wherein, for any particular stage p, a TADp module provides a delay equal to the sum of the delays introduced by a BPFp module and a LPFp portion of a FMD-LPFp module.

20. The system of claim 12 wherein said integrator inverts by integration the rate-of-change of phase measurement for each stage.

21. A method, including a plurality of stages, for estimating angle-modulation of an electromagnetic signal, comprising the steps of:

band-pass filtering a complex envelope signal derived from said electromagnetic signal to reject distortion;

measuring a rate-of-change of phase of said complex envelope signal after said step of band-pass filtering;

low-pass filtering said rate-of-change of phase commensurate with bandwidth of a message component of said complex envelope signal;

said steps of band-pass filtering, measuring, and low-pass filtering yielding a real signal derived from said complex envelope signal;

setting for each stage a first delay for said complex envelope signal equal to any delay introduced in said steps of band-pass and low-pass filtering;

for all stages except a first, setting a second delay for said real signal equal to said first delay;

for each stage after said first, summing (1) said real signal as modified by said second delay and prior stages if any and (2) an output from said steps of band-pass and low-pass filtering;

integrating said real signal as modified by said second delay if present and prior stages if any;

processing a negated output of said step of integrating to produce a modulated signal; and     transmitting at least one signal modified by said steps of band-pass filtering, measuring, low-pass filtering, setting, summing, integrating, and processing from one stage to a following stage if one is present.

22. The method of claim 21 wherein said steps of setting each employs feed-forward in a multiple-stage process having 1 through M stages, wherein each stage of said multiple-stage process incorporates said steps of band-pass filtering, measuring, low-pass filtering, setting a first delay, summing, integrating, and processing and stages 2 through M also incorporate said step of setting a second delay.

23. The method of claim 22 wherein distortion in said electromagnetic signal is diminished by iterative estimating from stage to stage.

24. The method of claim 23 wherein iterative estimating results in a final modulation index reduction in Stage M such that a BPFM module has a bandwidth effective for passing a reduced-index signal and rejecting additive distortion.

* * * * *